(12) United States Patent
Disney et al.

(10) Patent No.: US 10,643,990 B2
(45) Date of Patent: May 5, 2020

(54) ULTRA-HIGH VOLTAGE RESISTOR

(71) Applicant: GLOBALFOUNDRIES Singapore Pte. Ltd., Singapore OT (SG)

(72) Inventors: Donald R. Disney, Cupertino, CA (US); Jongjib Kim, Singapore (SG); Wen-Cheng Lin, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/907,866

(22) Filed: Feb. 28, 2018

(65) Prior Publication Data
US 2019/0267369 A1  Aug. 29, 2019

(51) Int. Cl.
| | |
|---|---|
| H01L 27/06 | (2006.01) |
| H01L 27/02 | (2006.01) |
| H01L 49/02 | (2006.01) |
| H01L 23/64 | (2006.01) |
| H01L 27/08 | (2006.01) |
| H01L 21/3215 | (2006.01) |

(52) U.S. Cl.
CPC .... H01L 27/0629 (2013.01); H01L 21/32155 (2013.01); H01L 23/647 (2013.01); H01L 27/0207 (2013.01); H01L 27/0288 (2013.01); H01L 27/0802 (2013.01); H01L 28/20 (2013.01)

(58) Field of Classification Search
None
See application file for complete search history.

(56) References Cited

U.S. PATENT DOCUMENTS

| | | | |
|---|---|---|---|
| 2002/0047183 A1* | 4/2002 | Shiiki | H01L 21/84 257/538 |
| 2011/0038184 A1 | 2/2011 | Sutardja et al. | |
| 2012/0126878 A1* | 5/2012 | Gagne | H03K 17/145 327/378 |
| 2013/0032862 A1* | 2/2013 | Su | H01L 27/0802 257/272 |
| 2014/0266409 A1 | 9/2014 | Lin et al. | |
| 2019/0109130 A1* | 4/2019 | Yoshino | H01L 23/5286 |

FOREIGN PATENT DOCUMENTS

TW        201436169        9/2014

OTHER PUBLICATIONS

Chen et al., "800V Ultra-High-Voltage Start-up Mechanism for Preregulator in Power Factor Correction (PFC) Controller", IEEE, 2011, 4 pages.
Nah et al., "On the ESD Self-Protection Capability of Integrated UHV Resistor", IEEE, 2016, 4 pages.
Taiwanese Office Action and Search Report in related TW Application No. 107116794 dated Mar. 18, 2019, 10 pages.
Taiwanese Office Action and Search Report in related TW Application No. 107116794 dated Nov. 7, 2019, 7 pages.

* cited by examiner

*Primary Examiner* — Erik Kielin
(74) *Attorney, Agent, or Firm* — David Cain; Andrew M. Calderon; Roberts Calderon Safran & Cole, P.C.

(57) ABSTRACT

The present disclosure relates to semiconductor structures and, more particularly, to an ultra-high voltage resistor and methods of manufacture. The structure includes at least one resistor coupled to a well of a doped substrate, the at least one resistor being separated vertically from the well by an isolation region with one end of the resistor being attached to an input pad and another end coupled to circuitry.

20 Claims, 3 Drawing Sheets

ULTRA-HIGH VOLTAGE RESISTOR

The present disclosure relates to semiconductor structures and, more particularly, to an ultra-high voltage resistor and methods of manufacture.

BACKGROUND

Ultra-high voltage (UHV) circuits, such as control ICs for AC/DC power conversion, often need a means for self-biasing and/or start-up from a high-voltage DC supply. Ultra-high voltage start-up for AC/DC control of integrated circuits (IC) has typically been implemented using either a discrete high-value resistor placed on the printed circuit board (PCB) or by a normally-ON ultra-high voltage transistor, either integrated in the IC or as a discrete component on the PCB.

SUMMARY

In an aspect of the disclosure, a structure comprises at least one resistor coupled to a well of a doped substrate, the at least one resistor being separated vertically from the well by an isolation region with one end of the resistor being attached to an input pad and another end coupled to circuitry.

In an aspect of the disclosure, a structure comprises: a diode coupled to at least one N-well; at least one polysilicon resistor over the N-well, separated vertically by a dielectric material; an input pad coupled to the at least one polysilicon resistor at one end; and circuitry coupled to another end of the at least one polysilicon resistor.

In an aspect of the disclosure, a structure comprises: a first resistor coupled to an N-well and separated vertically by a dielectric material; a second resistor coupled to another N-well and separated vertically by the dielectric material; and the first resistor and the second resistor are coupled together in series, with an input end of the first resistor coupled to a voltage pad and the output end of the second resistor coupled to circuitry.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to an ultra-high voltage (UHV) resistor and methods of manufacture. More specifically, the present disclosure relates to an ultra-high voltage resistor for AC-DC controllers. Advantageously, the methods of manufacturing of the ultra-high voltage resistor can reduce wafer cost significantly by reducing the required size of the resistor (e.g., layout area) and the number of masks needed in the fabrication process, as an example. The ultra-high voltage resistor can also substitute for a normally-ON transistor for a start-up function in cost-sensitive applications.

In embodiments, the ultra-high voltage resistor can be a polysilicon resistor integrated in a CMOS process. The ultra-high voltage resistors described herein can have a voltage rating of over 400 V, as an example. In embodiments, the ultra-high voltage resistor is formed over a high-voltage N-well in a lightly doped P-type substrate. The ultra-high voltage resistor can be separated vertically from the N-well by a dielectric layer, with one end of the resistor attached to a high voltage (HV) input pad and the opposite end of the resistor attached to low-voltage circuitry. In additional embodiments, the polysilicon resistor can have a spiral shape formed over a drift region of a high-voltage diode. The high-voltage well can be coupled to an intermediate position along the polysilicon resistor, such that the N-well voltage is less than the high voltage input pad. In addition, the intermediate position is chosen to limit the maximum potential across the dielectric layer such that the dielectric layer is reliable for the intended use condition. The polysilicon resistor can also be doped with impurity atoms such that it has a temperature coefficient of about 150 ppm, as an example.

The ultra-high voltage resistor of the present disclosure can be manufactured in a number of ways using a number of different tools. In general, though, the methodologies and tools are used to form structures with dimensions in the micrometer and nanometer scale. The methodologies, i.e., technologies, employed to manufacture the ultra-high voltage resistor of the present disclosure have been adopted from integrated circuit (IC) technology. For example, the structures are built on wafers and are realized in films of material patterned by photolithographic processes on the top of a wafer. In particular, the fabrication of the ultra-high voltage resistor uses three basic building blocks: (i) deposition of thin films of material on a substrate, (ii) applying a patterned mask on top of the films by photolithographic imaging, and (iii) etching the films selectively to the mask.

Figure 1:
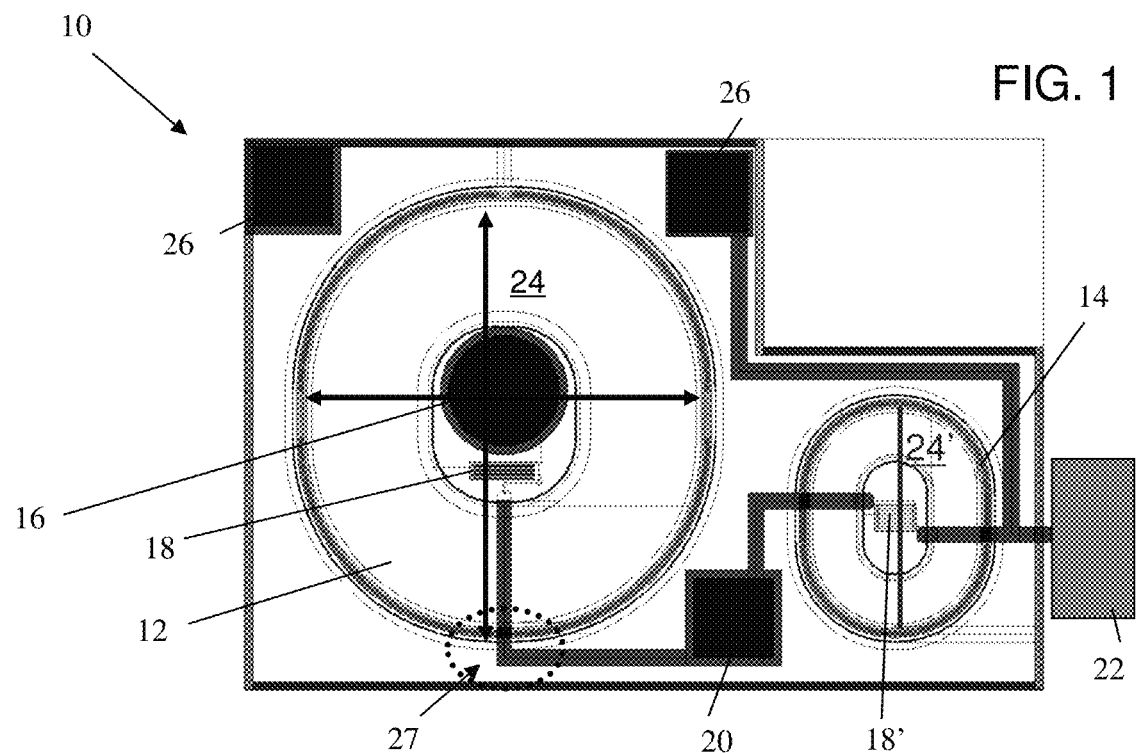
FIG. 1 shows a structure with an ultra-high voltage resistor, amongst other features, in accordance with aspect of the present disclosure.

FIG. 1 shows a structure with ultra-high voltage resistors, amongst other features, in accordance with aspect of the present disclosure. In particular, the structure 10 includes a first ultra-high voltage diode 12 and a second ultra-high voltage diode 14 in respective N-wells 24, 24'. In embodiments, the N-wells 24, 24' can be a same well, divided into two separate segments with different well voltages. The first ultra-high voltage diode 12 and the second ultra-high voltage diode 14 are connected in series. The first ultra-high voltage diode 12 can be, e.g., a 700 V junction diode, connected to a high voltage source 16, e.g., a high voltage pad coming from a voltage source of about 900 V.

Still referring to FIG. 1, an ultra-high voltage resistor 18 is formed over the first ultra-high voltage diode 12 and an ultra-high voltage resistor 18' is formed over the ultra-high voltage diode 14. In more specific embodiments, the N-wells 24, 24' are tied to the center point of each resistor 18, 18' to minimize the voltage across an insulating material that vertically separates the resistors 18, 18' from the respective N-wells 24, 24'. In further embodiments, the ultra-high voltage resistors 18, 18' are in series, with a metal pad 20 interposed between the ultra-high voltage resistors 18, 18'. The output of the ultra-high voltage resistor 18' is also coupled to low-voltage circuitry 22, e.g., circuitry which uses very low voltages, e.g., 200 V or less. A plurality of metal pads 26 can also be provided to monitor the circuitry, for example.

In embodiments, the ultra-high voltage resistors 18, 18' can be composed of polysilicon material, e.g., rho poly, each of which are formed over the respective N-well 24, 24' in a lightly doped P-type substrate. In more specific embodiments, the ultra-high voltage resistors 18, 18' can be composed of high resistivity polysilicon (which will minimize area layout). For example, the ultra-high voltage resistors 18, 18' can be lightly doped with, e.g., boron, or other species. More specifically, the ultra-high voltage resistors 18, 18' can be doped with impurity atoms such that it has a temperature coefficient of about 150 ppm, as an example (due to available space). In other examples, the temperature coefficient can be about 1600 ppm due to the limited space available, e.g., which requires minimized resistor size. In this way, the ultra-high voltage resistors 18, 18' will exhibit a high positive temperature coefficient to counter the negative temperature coefficient of the high rho poly. The ultra-high voltage resistors 18, 18' are also separated laterally from the N-wells 24, 24' by an-isolation design rule.

Still referring to the structure 10 of FIG. 1, the isolation regions are limited to about 200 V potential between any portion of the ultra-high voltage resistors 18, 18' and the underlying N-wells 24, 24'. By this configuration, the maximum voltage drop for a given resistor/well is about 400 V (by connecting a mid-point of the ultra-high voltage resistors 18, 18' to the N-wells 24, 24'). Also, to achieve a target 800 V drop from the high voltage pad 16 to the output, e.g., low-voltage circuitry 22, the ultra-high voltage resistors 18, 18' and the respective underlying N-wells 24, 24' are coupled in series. Also, in embodiments, the junction bias voltage of the first N-well 24 can be >600 V and the second N-well 24' can be >200 V, so that it is possible to use a smaller drift region of the diode 12 of the second N-well 24'. It should also be recognized that the connection from the low-voltage end of the ultra-high voltage resistor 18 to the high-voltage end of the ultra-high voltage resistor 18' crosses over the N-well 24, providing a weak point 27 which lowers the maximum bias voltage of the N-well 24.

In operation, the output of the ultra-high voltage resistor 18 will exhibit a voltage drop, which is input to the high voltage input of the ultra-high voltage resistor 18'. In turn, the output of the ultra-high voltage resistor 18' will exhibit a voltage drop, which is input into the low-voltage circuitry 22, e.g., circuitry which uses very low voltage. By way of illustrative example, the voltage of the high voltage pad 16 can be, e.g., 800 V, with the voltage output of the ultra-high voltage resistor 18 being about 400 V (at the metal pad 20). The 400 V can be input into the ultra-high voltage resistor 18' with its output exhibiting a voltage drop to almost 400 V, which is then provided to the low-voltage circuitry 22.

Figure 2:
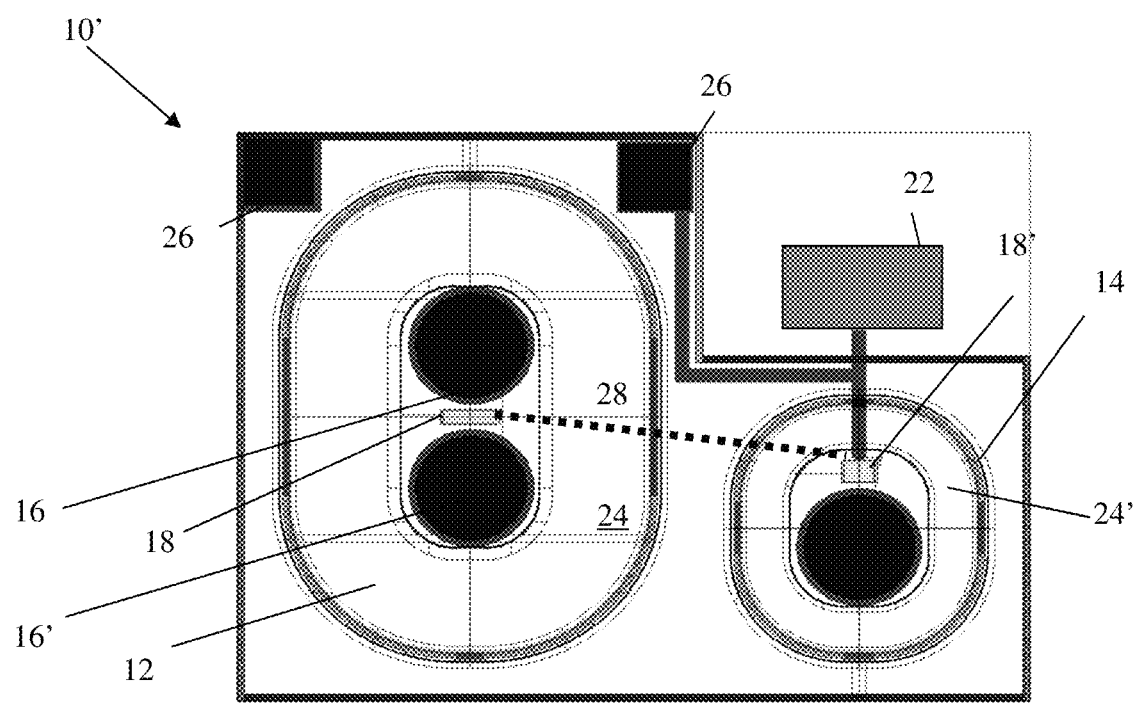
FIG. 2 shows a structure with an ultra-high voltage resistor, amongst other features, in accordance with an additional aspect of the present disclosure.

FIG. 2 shows a structure with ultra-high voltage resistors, amongst other features. Specifically, in the structure 10' of FIG. 2, an additional bond pad 16' is provided in the N-well 24. In addition, a bond wire representatively shown at reference numeral 28 is used to directly connect the low-voltage end of the ultra-high voltage resistor 18 to the high-voltage end of the ultra-high voltage resistor 18'. Accordingly, this configuration will avoid the metal crossover weakness for higher voltage capability as shown in the structure 10 of FIG. 1.

Figure 3A:
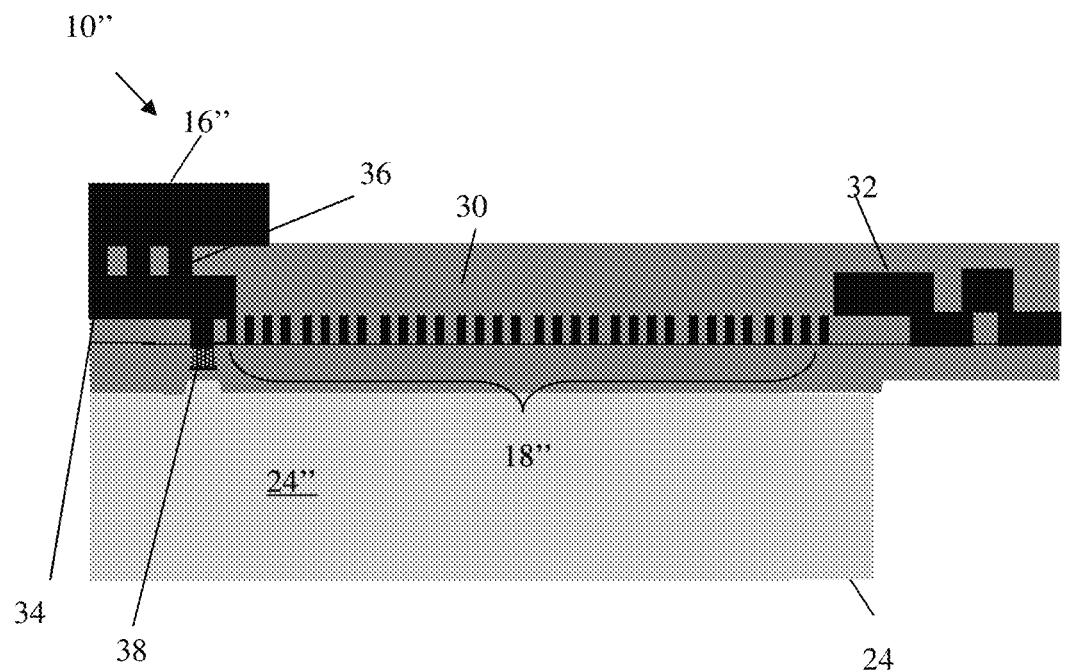
FIG. 3A shows a cross-sectional view of a structure with a spiral ultra-high voltage resistor, amongst other features, in accordance with an additional aspect of the present disclosure.

FIG. 3A shows a cross-sectional view of a structure with a spiral ultra-high voltage resistor, amongst other features. In particular, the structure 10" includes a spiral wiring 18", e.g., ultra-high voltage resistor, embedded in a dielectric material 30, e.g., oxide material, and connected between a high voltage pad 16' and pins 32. In embodiments, the spiral wiring 18" is a low-resistivity poly material fabricated with conventional CMOS fabrication processes, e.g., lithography, etching, deposition and planarization. In embodiments, the spiral wiring 18" provides voltage drop due to the length of its windings.

Still referring to FIG. 3A, the spiral wiring 18" is connected to the high voltage pad 16' by wiring 34 and interconnect structure 36. The wiring 34 is connected to the N-well 24 by an n+ contact 38. In embodiments, the spiral wiring 18" is formed over the drift region 24" of the diode 12, e.g., over the N-well 24, such that the voltage from the spiral wiring 18", e.g., resistor, to the N-well 24 at any point is very small. The drift region 24" can be about 200 um to 400 um which can be determined by bias conditions in length; although other dimensions are contemplated herein. In embodiments, the drift region 24" can be representative of an ultra-high voltage diode 12 as shown by the top view of FIG. 3B.

In embodiments, the spiral wiring 18" has several legs or windings, each of which will exhibit a voltage drop. By way of more specific example, the spiral wiring 18" can include about 10 or more windings and more specifically 5 to 100 windings which can be determined by biasing conditions over the drift region 24" of the N-well 24, each winding of which will exhibit approximately a same voltage drop. In this configuration, for example, the high voltage pad 16" can exhibit a voltage of approximately 600 V; whereas, the voltage at the output pads 32 will be almost 0 V. By implementing this configuration, the isolation BV limitation can be avoided.

Figure 3B:
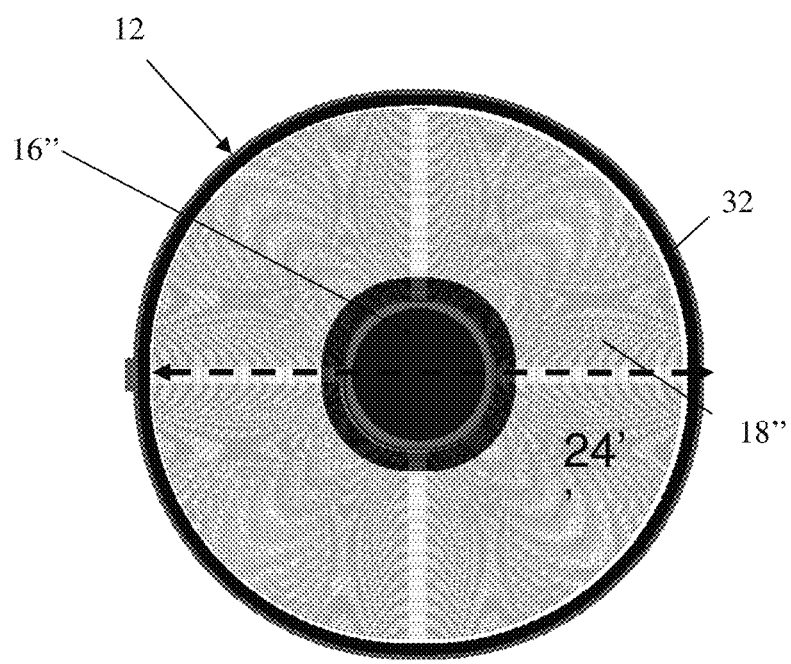
FIG. 3B shows a top view of the structure of FIG. 3A.
Figure 4:
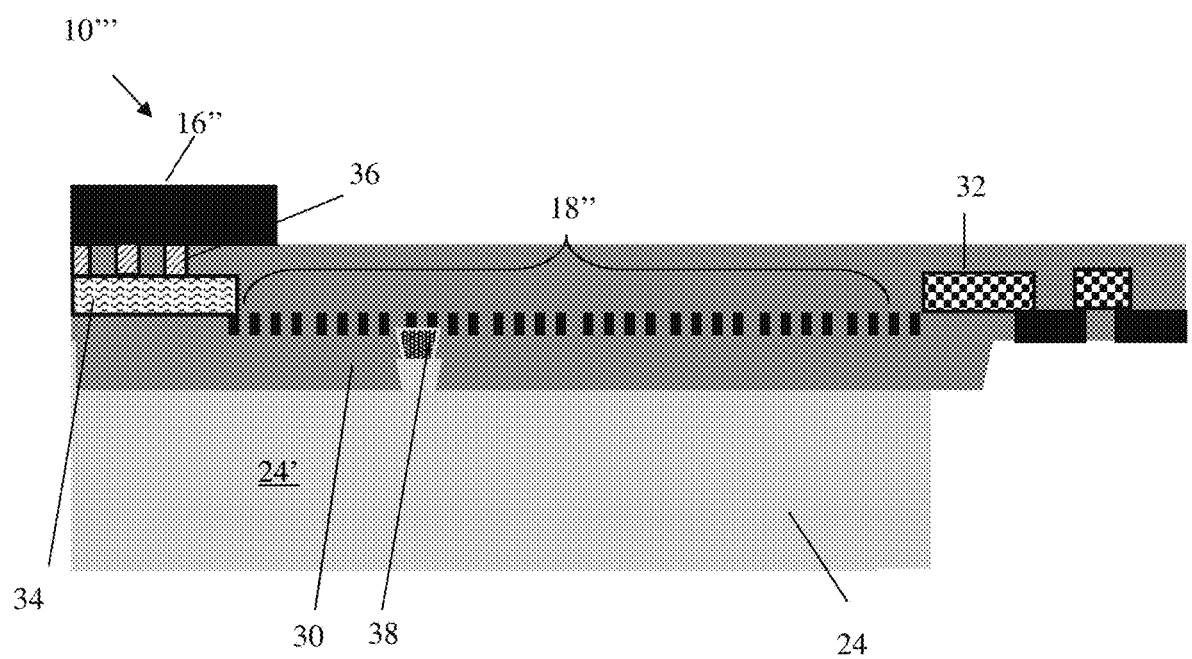
FIG. 4 shows a cross-sectional view of a structure with a spiral ultra-high voltage resistor, amongst other features, in accordance with yet an additional aspect of the present disclosure.

FIG. 4 shows a structure 10''' with a spiral ultra-high voltage resistor, similar to that shown in FIGS. 3A and 3B. In the structure 10''', though, the N-well 24 is connected to an intermediate position on the spiral resistor 18". In this way, the required well voltage is less than the total high voltage on the pad 16". For example, the well voltage can be 700 V; whereas, the high voltage on the pad 16" can be 900 V. The intermediate position is also chosen to limit a maximum potential across the dielectric material 30.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
a first voltage diode in a first well region of a doped substrate;
a second voltage diode in a second well region of the doped substrate, the second voltage diode being connected in series to the first voltage diode;
a first resistor coupled to the first well region and over the first voltage diode, the first resistor being separated vertically from the first well region by an isolation region with one end of the first resistor being attached to an input pad; and
a second resistor coupled to the second well region and over the second voltage diode, with one end of the second resistor serially connected to the first resistor and another end of the second resistor coupled to circuitry.

2. The structure of claim 1, wherein the first resistor and the second resistor are high resistivity polysilicon resistors with a metal pad interposed between the first resistor and the second resistor.

3. The structure of claim 2, wherein the high resistivity polysilicon resistors are doped with impurity atoms.

4. The structure of claim 1, wherein the first resistor is a spiral shape.

5. The structure of claim 4, wherein the first well is an N-well coupled to an intermediate position along the spiral shape resistor such that a voltage of the N-well is less than a voltage of the input pad.

6. The structure of claim 5, wherein the spiral shape is formed over a drift region of the first voltage diode.

7. The structure of claim 2, wherein
the first and second resistors are each coupled to an N-well with a junction bias of a first N-well >600 V and a junction bias of a second N-well >200 V such that a drift region of the second voltage diode of the second N-well is smaller than that of the first voltage diode;
an isolation region which separates the first resistor from the first N-well and the second resistor from the second N-well is limited to about 200 V potential between any portion thereof; and
the first resistor and the first N-well are coupled in series and the second resistor and the second N-well are coupled in series.

8. A structure comprising:
a diode coupled to at least one N-well and connected in series with a second diode;
a first polysilicon resistor over the at least one N-well and over the diode, separated vertically by a dielectric material;
a second polysilicon resistor over the at least one N-well and over the second diode, the second polysilicon resistor connected in series with the first polysilicon resistor;
a metal pad interposed between the first polysilicon resistor and the second polysilicon resistor;
an input pad coupled to the first polysilicon resistor at one end; and
circuitry coupled to an end of the second polysilicon resistor.

9. The structure of claim 8, wherein the first and second polysilicon resistors are high resistivity polysilicon resistors doped with impurity atoms such that the first and second polysilicon resistors have a temperature coefficient about 150 ppm.

10. The structure of claim 9, wherein:
the first and second polysilicon resistors are high resistivity polysilicon resistors which are electrically connected in series;
the at least one N-well is a first N-well electrically connected in series to one of the high resistivity polysilicon resistors and a second N-well electrically connected in series to another of the high resistivity polysilicon resistors;
the diode is associated with the first N-well and the second diode is associated with the second N well; and
a junction bias of the first N-well is >600 V and a junction bias of the second N-well is >200 V such that a drift region of the second diode of the second N-well is smaller than that of the diode.

11. The structure of claim 8, wherein at least the first polysilicon resistor is a spiral shape.

12. The structure of claim 11, wherein the at least one N-well coupled to an intermediate position along the spiral shape resistor.

13. The structure of claim 12, wherein a voltage of the at least one N-well is less than a voltage of the input pad.

14. The structure of claim 13, wherein the intermediate position is chosen to limit a maximum potential across the dielectric material.

15. The structure of claim 11, wherein the spiral shape is formed over a drift region of the diode.

16. A structure comprising:
a first diode coupled to a first N-well;
a second diode in series connection to the first diode and coupled to a second N-well;
a first resistor over the first diode and coupled to the first N-well and separated vertically therefrom by a dielectric material;
a second resistor over the second diode and coupled to the second N-well and separated vertically therefrom by the dielectric material; and
the first resistor and the second resistor are coupled together in series, with an input end of the first resistor coupled to a voltage pad and an output end of the second resistor coupled to circuitry.

17. The structure of claim 16, wherein the first resistor and the second resistor are high resistivity polysilicon resistors.

18. The structure of claim 17, wherein the first resistor and the second resistor have a voltage rating of over 400 V.

19. The structure of claim 16, wherein the first resistor and the second resistor are polysilicon resistors doped with impurity atoms and further comprising a metal pad interposed between the first resistor and the second resistor.

20. The structure of claim 16, wherein the first resistor is electrically connected to the first diode over the first N-well in series and the second resistor is electrically connected to the second diode over the second N-well in series, and a metal pad is disposed between the first resistor and the second resistor which are in series.

* * * * *

UNITED STATES PATENT AND TRADEMARK OFFICE
CERTIFICATE OF CORRECTION

Page 1 of 1

PATENT NO. : 10,643,990 B2
APPLICATION NO. : 15/907866
DATED : May 5, 2020
INVENTOR(S) : Donald R. Disney It is certified that error appears in the above-identified patent and that said Letters Patent is hereby corrected as shown below:

In the Claims

In Claim 10, Line 18 at Column 6, change "N well" to "N-well".

Signed and Sealed this
Thirtieth Day of June, 2020

Andrei Iancu
*Director of the United States Patent and Trademark Office*